United States Patent
Bentley et al.

(10) Patent No.: US 10,236,379 B2
(45) Date of Patent: Mar. 19, 2019

(54) VERTICAL FET WITH SELF-ALIGNED SOURCE/DRAIN REGIONS AND GATE LENGTH BASED ON CHANNEL EPITAXIAL GROWTH PROCESS

(71) Applicant: GLOBALFOUNDRIES INC., Grand Cayman (KY)

(72) Inventors: Steven Bentley, Menands, NY (US); Puneet Harischandra Suvarna, Menands, NY (US); Julien Frougier, Albany, NY (US); Bartlomiej Jan Pawlak, Leuven (BE)

(73) Assignee: GLOBALFOUNDRIES INC., Grand Cayman (KY)

( * ) Notice: Subject to any disclaimer, the term of this patent is extended or adjusted under 35 U.S.C. 154(b) by 23 days.

(21) Appl. No.: 15/593,651

(22) Filed: May 12, 2017

(65) Prior Publication Data
US 2018/0331213 A1     Nov. 15, 2018

(51) Int. Cl.
| | |
|---|---|
| *H01L 21/336* | (2006.01) |
| *H01L 29/78* | (2006.01) |
| *H01L 29/66* | (2006.01) |
| *H01L 29/10* | (2006.01) |

(52) U.S. Cl.
CPC ...... *H01L 29/7827* (2013.01); *H01L 29/1033* (2013.01); *H01L 29/66666* (2013.01); *H01L 29/66795* (2013.01); *H01L 29/785* (2013.01)

(58) Field of Classification Search
CPC ............... H01L 29/775; H01L 29/7827; H01L 21/823885; H01L 29/1033; H01L 29/66666; H01L 29/66795; H01L 29/785; H01L 21/823487; H01L 21/823431; H01L 21/823821; H01L 27/2454; H01L 27/10879; H01L 27/1082
See application file for complete search history.

(56) References Cited

U.S. PATENT DOCUMENTS

| | | | |
|---|---|---|---|
| 8,637,849 | B2 | 1/2014 | Deligianni et al. |
| 9,431,305 | B1 | 8/2016 | Anderson et al. |
| 9,530,863 | B1 | 12/2016 | Zhang et al. |
| 9,530,866 | B1 | 12/2016 | Zhang et al. |
| 9,530,963 | B2 | 12/2016 | Lim et al. |
| 9,536,793 | B1 | 1/2017 | Zhang et al. |
| 9,601,491 | B1 | 3/2017 | Mallela et al. |
| 9,640,636 | B1 | 5/2017 | Bentley et al. |

(Continued)

*Primary Examiner* — Meiya Li
(74) *Attorney, Agent, or Firm* — Gibb & Riley, LLC; Anthony J. Canale

(57) ABSTRACT

A fin extends from, and is perpendicular to, a planar surface of a substrate. A self-aligned bottom source/drain conductor is on the substrate adjacent the fin, a bottom insulator spacer is on the bottom source/drain conductor adjacent the fin, and a gate insulator is on a channel portion of the fin. A gate conductor is on the gate insulator, a self-aligned top source/drain conductor contacts the channel portion of the fin distal to the bottom insulator spacer, a top gate length limit insulator is positioned where the channel portion meets the top source/drain conductor, and a bottom gate length limit insulator is positioned where the channel portion meets the bottom insulator spacer. The gate length of the gate conductor is defined by a distance between the gate length limit insulators.

20 Claims, 17 Drawing Sheets

(56) References Cited

U.S. PATENT DOCUMENTS

2009/0256194 A1* 10/2009 Kim .................. H01L 27/10885
                                                              257/330
2012/0248529 A1   10/2012 Liu et al.
2017/0373166 A1* 12/2017 Bergendahl ........... H01L 29/785

* cited by examiner

VERTICAL FET WITH SELF-ALIGNED SOURCE/DRAIN REGIONS AND GATE LENGTH BASED ON CHANNEL EPITAXIAL GROWTH PROCESS

BACKGROUND

Field of the Invention

The present disclosure relates to solid-state transistor devices and methods, and more specifically, to vertical field effect transistors (FETs) that have self-aligned source/drain regions, and a gate length that is based on the epitaxial growth process used to from the channel.

Description of Related Art

Many different types of solid-state transistors can be created using different impurities, different impurity locations, different impurity concentrations, etc. Additionally, such transistors can have different physical shapes that provide performance and space utilization benefits. For example, one type of transistor (a planar transistor) includes components that generally run parallel to the upper surface of an underlying substrate, while another type of transistor (a vertical transistor) uses a rectangular structure (e.g., a "fin") that has 5 exposed sides and is generally perpendicular to the upper surface of the substrate. In vertical transistors, the fin has sides that are perpendicular to the underlying substrate, and the sides are longer than the "top" surface (that is parallel to the upper surface of the substrate) and the "ends" that are also perpendicular to the top surface of the substrate (and perpendicular to the sides of the fin). Similarly, these structures can also be formed in a wire configuration, where the sides and ends may be of similar lengths, where the cross-sectional profile is, for example, mostly square or circular. In addition, vertical transistors may be included of multiple such structures in a single device. With such vertical transistors conductive source and drain regions are formed along such top and bottom surfaces, and the fin is used as a semiconducting channel. A gate insulator and gate conductor are generally formed over the fin, and voltage in the gate conductor can change the fin from an insulator to a conductor.

However, in vertical FETs, it can be challenging to control the gate length and the alignment of independently formed top and bottom junction doping regions to the gate, while staying within the various thermal budget restrictions that arise during transistor manufacturing. Since gate length is defined vertically from the planar surface of the substrate, it is usually established by a timed etchback process; however, in such processing the top edge of the gate can have variability, which may result in some gates being too short to be effective, or too long (resulting in short circuits). Additionally, even if the gate conductor is properly formed, aligning the top and bottom source drain regions to the gate, can be difficult because the three items are typically defined independently.

SUMMARY

Methods herein form at least one fin extending from, and perpendicular to, a planar surface of a substrate. While actual production simultaneously forms many fins adjacent one another, the following discussion is framed in the context of a single fin, as any simultaneously formed fins can have the same features (although possibly different doping polarities in such features). The fin includes a channel fin portion closest to the substrate (adjacent the substrate) and a hardmask fin portion furthest away from the substrate (distal to the substrate). To somewhat simplify the following discussion, the "channel" portion of the fin is considered everything below the hardmask, down to the substrate (even though some portions of this channel may include insulating spacers).

Such methods simultaneously form a top notch in the channel fin portion where the channel fin portion meets the hardmask fin portion, and potentially a second (bottom) notch in the channel fin portion between the top notch and where the channel fin portion meets the planar surface. The width of the channel fin portion is reduced at the top notch and the second notch. Such methods simultaneously form a gate length limit insulator in the top notch, and potentially a bottom gate length limit insulator in the second notch.

Such methods also replace the planar surface of the substrate with a bottom source/drain conductor. This involves protecting the fin and removing a substrate portion adjacent the planar surface, without affecting the fin, but using the fin to self-align the substrate portion that is removed. Then, this process forms (e.g., by epitaxial growth) the bottom source/drain in the substrate portion, again using only the protected fin to align the location of the bottom source/drain, avoiding any need for the alignment of masks or other features, and simply using the previously formed fin as the alignment feature.

Such methods similarly use self-aligned processing to replace the hardmask fin portion with a top source/drain. The process of replacing the hardmask fin portion with the top source/drain involves forming a sacrificial protective material on the fin (e.g., at least on the hardmask fin portion), and again this uses only the fin to align the location of the sacrificial protective material. Then, the hardmask fin portion is removed to leave a top source/drain opening in the sacrificial protective material where the hardmask fin portion was previously located. This top source/drain opening in the sacrificial protective material extends down to the channel fin portion. Then, the top source/drain can be formed only in the top source/drain opening and connected to the channel fin portion, (e.g., by being epitaxially grown on, or from, the channel fin portion within the top source/drain opening). Again, this formation process is self-aligned by the opening in the sacrificial protective material, and does not require the alignment of masks or other features.

Such methods form a bottom insulator spacer on the bottom source/drain conductor. The bottom insulator spacer is formed to extend a distance from the bottom source/drain conductor that is greater than or equal to the distance that the bottom gate length limit insulator is from the bottom source/drain conductor.

Additionally, these methods narrow the channel fin portion between the gate length limit insulator and the bottom insulator spacer to the same reduced width used for the top notch and second notch. Such methods form a gate insulator on at least the channel fin portion (the middle portion of the semiconductor fin), and then deposit a gate conductor on the fin.

Such methods then form a gate mask on the bottom insulator spacer. The thickness of the gate mask on the bottom insulator spacer is formed to be greater than the distance from the bottom spacer to the gate length limit insulator. In other words, the gate mask covers the bottom insulating spacer, and the lower portion of the fin, up to at least the top gate length limit insulator. With the gate mask in place, these methods remove the portion of the gate conductor on the fin that is left exposed by the gate mask. Alternatively, the gate materials may be etched directly using a timed etchback process where the remaining gate height is taller than the top gate length limit insulator.

Later, the gate mask is removed to leave the gate length of the gate conductor defined by the distance between the bottom spacer/bottom gate length limit insulator and the top gate length limit insulator. Therefore, instead of using a material removal (e.g., gate etchback) process to define the gate length, the distance between the gate length limit insulator and the bottom gate length limit insulator/bottom spacer defines an effective gate length that the gate conductor is adjacent the channel fin portion. Thus, with methods herein, the gate length of the gate conductor is determined by the vertical separation between the gate length limit insulators, as the thickness of the gate mask on the bottom insulator spacer is greater than the distance between the gate length limit insulators to prevent the process of removing the portion of the gate conductor on the fin that is exposed by the gate mask from removing any of the gate conductor between the top gate length limit insulator and the bottom insulator spacer/bottom gate length limit insulator. Thus, the process of removing the portion of the gate conductor on the fin that is exposed by the gate mask avoids affecting the gate length of the gate conductor, and the gate length of the gate conductor is not determined by a material removal process.

Such processing produces devices that can have at least one fin (and again, the following description in framed as a single fin device; however, multiple of the same fin could be included in one or more similar devices). Therefore, such a device includes a substrate, and a fin extending from, and perpendicular to, a planar surface of the substrate.

Additionally, a bottom source/drain conductor is on the substrate adjacent the fin, and a bottom insulator spacer is on the bottom source/drain conductor adjacent the fin. The bottom source/drain conductor can be epitaxially grown, and therefore, the bottom source/drain conductor has physical characteristics of epitaxial growth material, grown adjacent to, and self-aligned by the fin.

A gate insulator is on a channel fin portion, and a gate conductor is on the gate insulator. The channel fin portion extends a first distance from the substrate that is greater than a second distance the combination of the bottom source/drain conductor and the bottom insulator spacer extend from the substrate.

A top source/drain conductor contacts the channel fin portion distal to the bottom insulator spacer, and the bottom source/drain conductor and top source/drain conductor are self-aligned to the fin. The top source/drain conductor can be epitaxially grown, and therefore, the top source/drain conductor has physical characteristics of epitaxial growth material, grown from, and self-aligned by the channel fin portion.

With these devices, a gate length limit insulator is positioned where the channel fin portion meets the top source/drain conductor. Also, a bottom gate length limit insulator contacts the channel fin portion at the second distance from the substrate. The gate length of the gate conductor is defined by the distance between the bottom spacer/bottom gate length limit insulator and the top gate length limit insulator. Therefore, the distance between the top gate length limit insulator and the bottom spacer/bottom gate length limit insulator defines an effective gate length that the gate conductor is adjacent the channel fin portion. Thus, with these structures, the gate length of the gate conductor is determined by the position of gate length limit insulator, which avoids determining the gate length by material removal processes.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, in vertical field effect transistors (FETs) the top edge of the gate can have variability, which may result in some gates being too short to be effective, or too long (resulting in short circuits). Additionally, even if the gate conductor is properly formed, aligning the top and bottom source drain regions to the gate, can be difficult because the three items are typically defined independently.

In view of this, this disclosure presents methods for forming vertical FETs that have mask-less self-aligned source/drain regions that also self-align vertically to the gate edges, and a gate length that is controlled by the epitaxial growth process used to from the channel, and not based on the control of a gate length reduction etching process (gate conductor etchback). More specifically, the processes herein selectively create notches in the fin (Si channel) and form easily controlled spacers (insulators, such as oxides, nitrides) in the notches, to allow the gate length of the later formed gate conductor to be self-aligned between such spacers.

The locations of the notches (and later formed spacers) are established in processing that is very controllable. For example, before patterning any fins, and during the formation of the bulk stack, blanket epitaxial processes are used to create distinct layers that are selectively etchable to one another (e.g., Si and SiGe layers) so as to define the gate length and the locations of the top and bottom gate spacers. With such processing, the vertical dimensions of the channel and gate conductor can be precisely formed, which avoids gate length control using a much less accurate timed etchback process. Additionally, with processing herein, the top and bottom source/drains are also self-aligned to these edges.

This process truly scales with pitch, and is a true "gate last" process with the high-k and metal gate (HKMG) structures being formed after all significant thermal budgets have been completed. Therefore, rather than relying on the intrinsically variable timed etchback processes, the methods herein form vertical field effect transistors (FETs) that have self-aligned source/drain regions, and a gate length that is based on the epitaxial growth process used to from the channel.

Figure 1A:
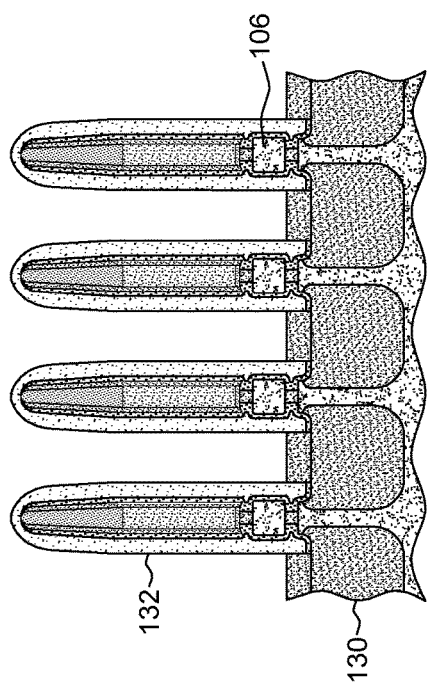
FIGS. 1A-14B are schematic diagrams illustrating perspective and cross-sectional views of partially formed vertical FETs formed according to embodiments herein.
Figure 1B:
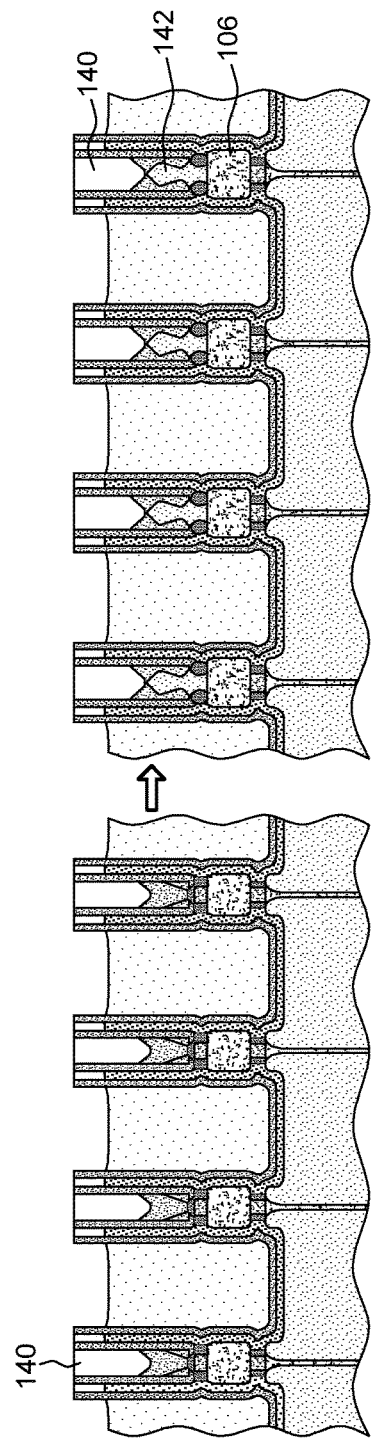
Figure 1C:
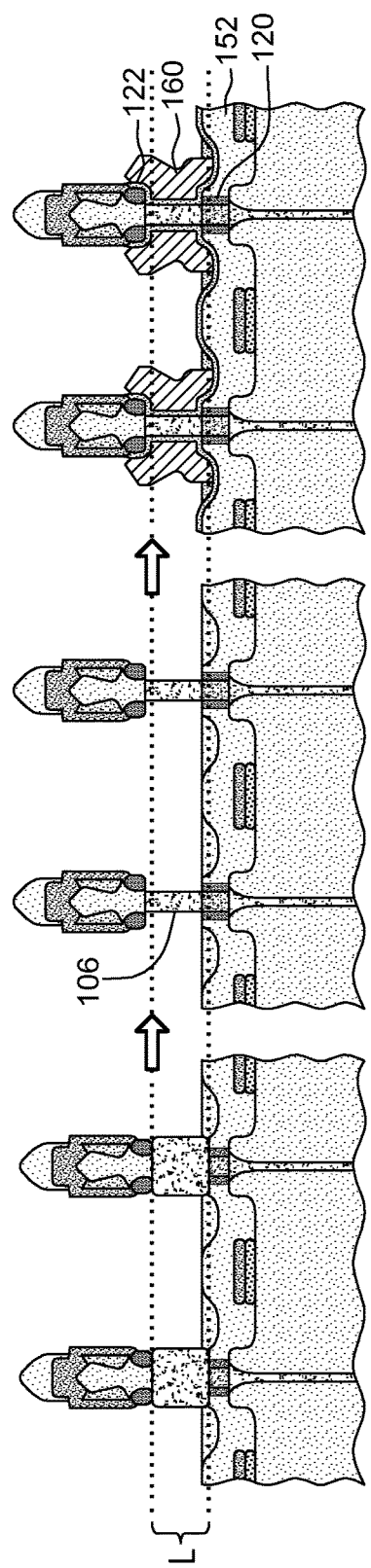

While FIGS. 1A-1C generally illustrate some concepts provided by this disclosure, and FIGS. 2A-15B discuss such structures/processes in greater detail. Note that the details of other unlabeled structures within FIGS. 1A-1C are discussed and labeled in FIGS. 2A-15B; however, such items are not labeled in FIG. 1A to avoid clutter and to keep reader focus on the generalized concepts that FIGS. 1A-1C illustrate.

Also, the "A" drawings are perspective drawings and that the "B" drawings are cross-sectional views of the same structures, in FIGS. 2A-15B.

With respect to the self-aligned bottom source/drain conductor 130, as shown in FIG. 1A, a protective mask material 132 on the fins self-aligns the conductive material formed at the bottom of the fins in order to self-align the bottom source/drain conductor 130 with the fin. Additionally, with respect to the self-aligned top source/drain conductor 142, as shown in FIG. 1B, an opening is formed in the hardmask 140 that is on the channel fin portion region 106 of the fin to allow the top source/drain conductor 142 to be grown on the channel fin portion region 106 of the fin, to self-align the top source/drain conductor 142 with the fin. FIG. 1C illustrates that spacers 120, 122 are formed in notches in the channel fin portion region 106 of the fin, and that such spacers 120, 122 limit the gate length L of the gate conductor 160 to the area of the channel fin portion region 106 that is between the spacers 120, 122, and that the bottom spacer 152 isolates the gate from the bottom source/drain.

Figure 2A:
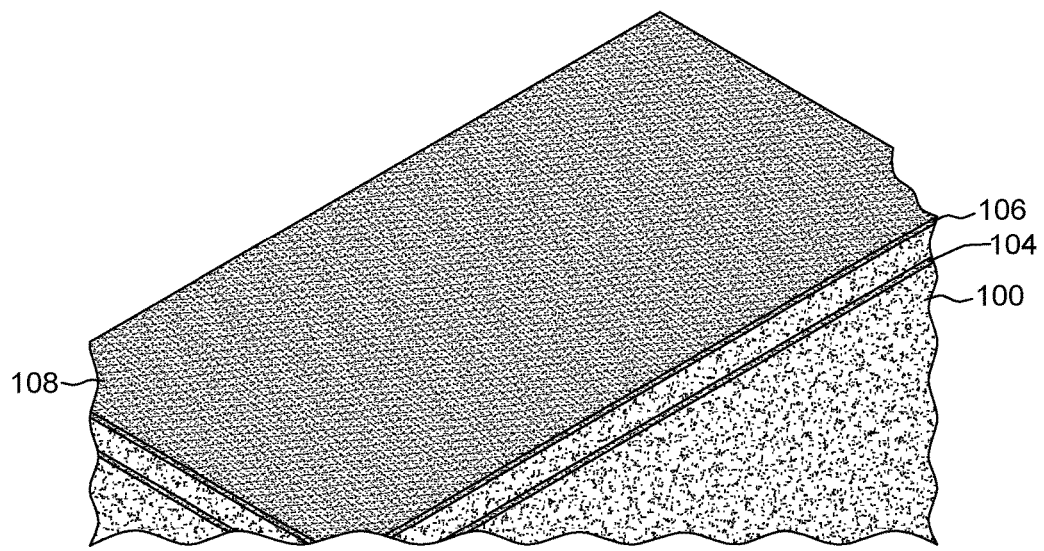
Figure 2B:
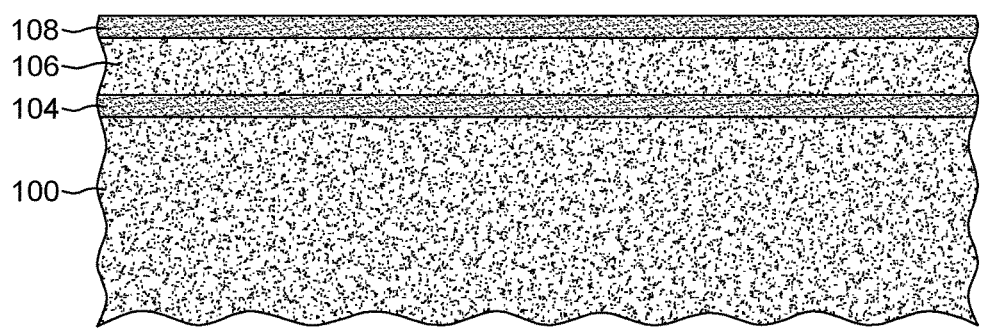

As shown in greater detail in FIGS. 2A-2B, a multi-layer channel fin portion stack is epitaxially formed. Such a stack can include, for example, a bulk bottom layer of Si (e.g., substrate 100), which can be supplied or grown, and in its undoped state, is an insulator. A relatively thinner (thinner than the substrate 100) dissimilar layer (e.g., SiGe or doped Si) 104 is formed (e.g., epitaxially grown) on the substrate 100. Additionally, an overlying thicker (thicker than the thinner layer 104) layer 106 of silicon, is then formed (e.g., grown on, deposited on, attached to, etc.) the doped layer 104. Another thinner (e.g., of approximately the same thickness as layer 104) doped layer 108 (of similar material to the first thinner doped layer) is formed (e.g., epitaxially grown) on the thicker layer 106.

Additional layers can be grown on this stack 104-108 shown in FIGS. 2A-2B; however, of note is that the thickness of the thinner layers 104, 108 can be very well controlled by current manufacturing methods (e.g., epitaxial growth methods). Similarly, the thickness of the silicon layer 106 is also something that is controlled very reliably with current manufacturing methods (e.g., also through the use of epitaxial growth.). The thickness of, and distance between, the thinner layers 104, 108 will eventually define the gate length (L, in FIG. 1C); and, therefore, the ability to use existing manufacturing techniques to provide repeatable and very precise control of the locations and thicknesses of layers 104, 106, and 108 allows the gate length L of the later-formed gate conductor to be precisely controlled (during the epitaxial formation processes shown in FIGS. 2A, 2B); which avoids having to control the channel fin portion length using the much less accurate and less consistent gate etchback processing (that conventionally occurs post-gate formation).

Figure 3A:
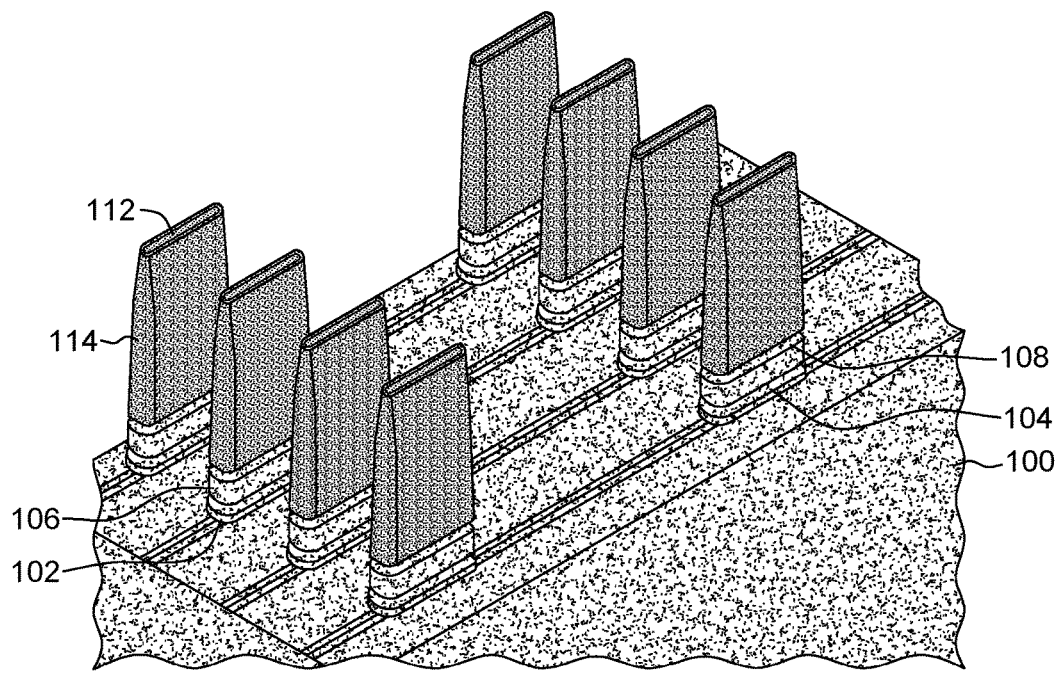
Figure 3B:
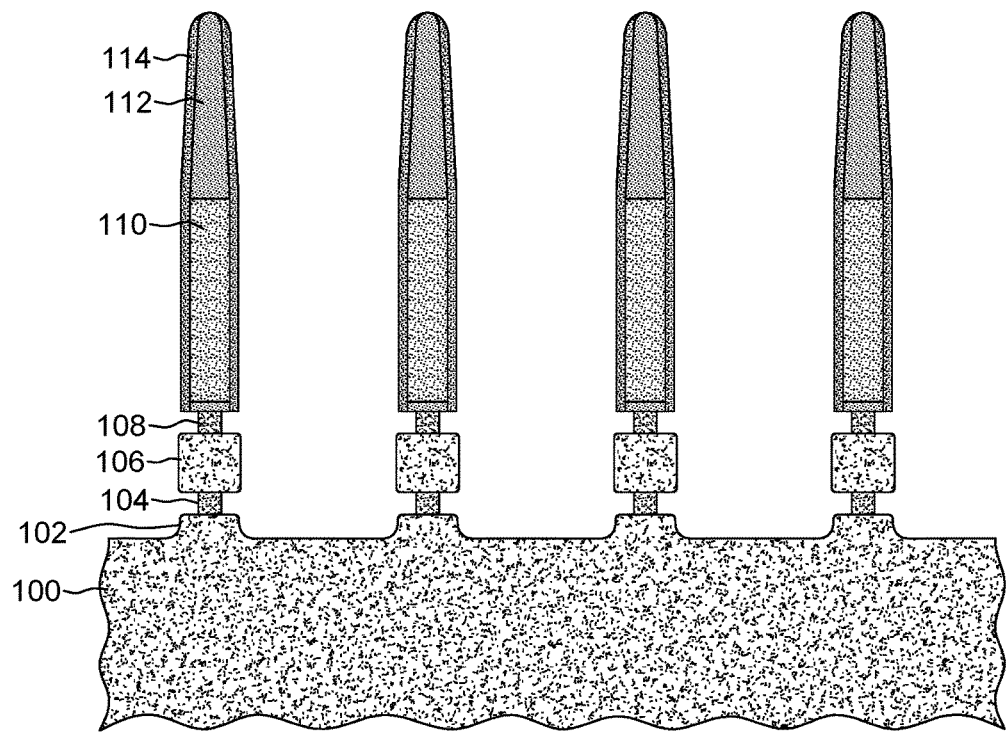

As shown in FIGS. 3A-3B, hardmask fin patterns (e.g., nitrides 110, oxides 112, etc.) are patterned on the multi-layer fin portion stack 104-108 (e.g., using conventional masking and material removal processing, such as self-aligned double patterning, self-aligned quadruple patterning, etc.). It should be noted that many materials may be used to form the hard mask, there may be one or more layers, or a single layer of one material may be used. Dissimilar spacers 114 are optionally formed on the sidewalls of the hardmask 110, 112 (e.g., nitride, oxide, low-k spacers). The dissimilar spacers 114 on the hardmasks increases the effective critical dimensions (CD), and creates a "boundary" for later epitaxial growth processes. The materials are selected have an etch selectivity to the fin hardmask (HM) (SiCO (silicon oxycarbide) or SiBCN (silicon borocyanide) for example).

As also shown in FIGS. 3A-3B, the channel fin portion 104-108 (which, again, can be over-generalized in this disclosure to include 104, 106, and 108) is then patterned out of the multi-layer fin portion stack 104-108, using any appropriate material removal process (e.g., etching, etc.) where the hardmasks 110-114 operate as the patterning mask. The fin patterning process removes material from the multi-layer fin portion stack 104-108, and should stop past the lower thinner doped layer 104, but as close to the lower thinner doped layer 104 as possible; however, the depth of the material removal process into the multi-layer channel fin portion stack is not critical, so long as both thinner doped layers 104, 108 are exposed by the material removal process. Such fin patterning leaves a small portion 102 of the substrate 100 as part of the overall fin.

FIGS. 3A-3B also show that such methods simultaneously form a top notch in the thinner doped layer 108 (e.g., generally in the channel fin portion 104-108, where the channel fin portion 104-108 meets the hardmask fin portion 110); and potentially a second (bottom) notch in the thinner doped layer 104 (e.g., generally in the channel fin portion 104-108 between the top notch 108 and where the channel fin portion 104-108 will meet the bottom spacer 150, 152, described below). More specifically, this processing is performed, for example, by selective material removal processing that attacks the material of the thinner doped layers 104, 108, without affecting the other exposed materials 100, 106, 114, etc. (e.g., selective etchback of spacer epitaxial layer over the channel fin portion to form the notches or cavities). Thus, in this processing, the width of the channel portion (e.g., 104-108) is reduced at the top notch 108 and the second (bottom) notch 104 through a very-well controlled and repeatable established material removal method. Similarly, this process could also be achieved using an oxidation-based technique.

Figure 4A:
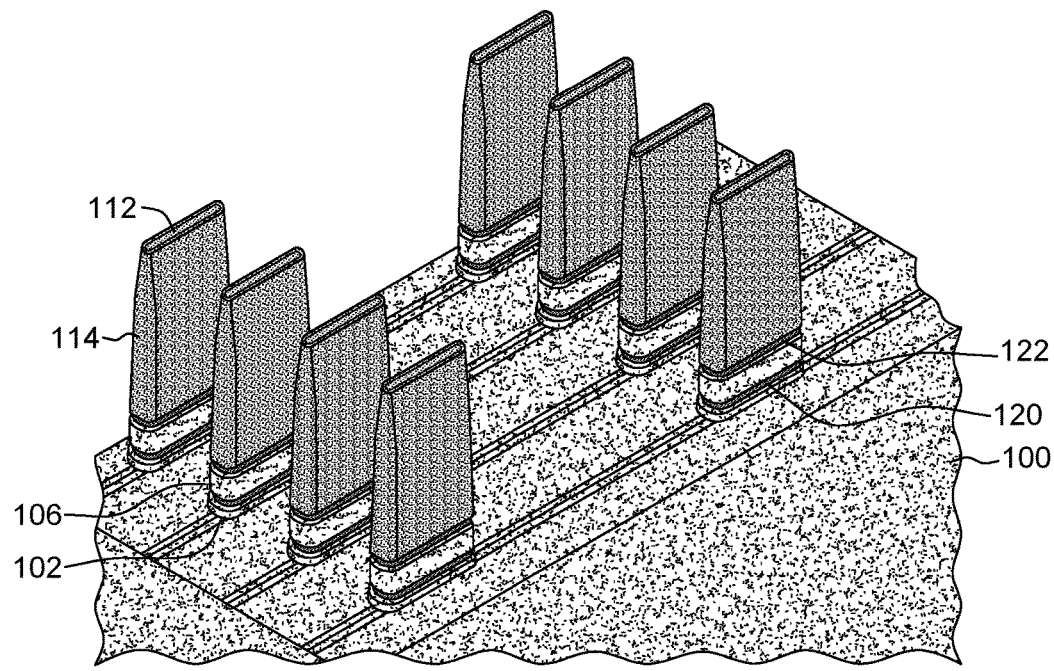
Figure 4B:
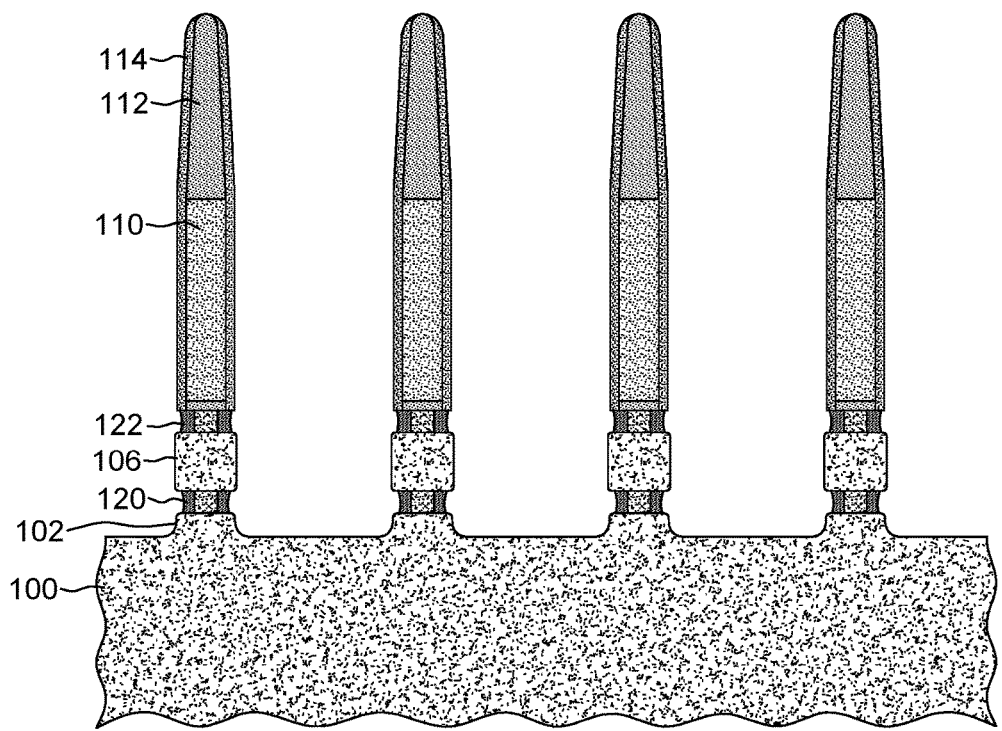

As shown in FIGS. 4A-4B, such processing simultaneously forms a gate length limit insulator 122 in the top notch 108, and a bottom gate length limit insulator 120 in the second notch 104 in an insulator formation/removal process. For example, processing that fills the notches with an insulator (e.g., atomic layer deposition (ALD) of a nitride, oxide, etc.) and covers all exposed surfaces with a blanket coating of the insulator, is followed by a material removal process that is controlled to allow the insulator to remain only in the notches, but to be removed from all other surfaces. The thickness of the thinner doped layers 104, 108 formed in FIGS. 2A-2B aids in the proper formation of the insulators 120, 122 by causing the notches to have a precisely controlled width (that is approximately equal to the thickness of the thinner doped layers 104, 108). The thickness of the thinner doped layers 104, 108 and the resulting notches is large enough to allow some of the insulator 120, 122 to fill the notches, but is small enough to prevent the subsequent process of removing the blanket coat of the insulator 120, 122 from removing the insulator 120, 122 from the notches. Again, the ability to repeatedly control the thickness of the thinner doped layers 104, 108 (e.g., epitaxial growth processes) allows the thickness of the notches to be similarly controlled, to reliably form the gate length limit insulators 120, 122 of the same size and in the same location across the wafer, and from processing run to processing run.

Figure 5A:
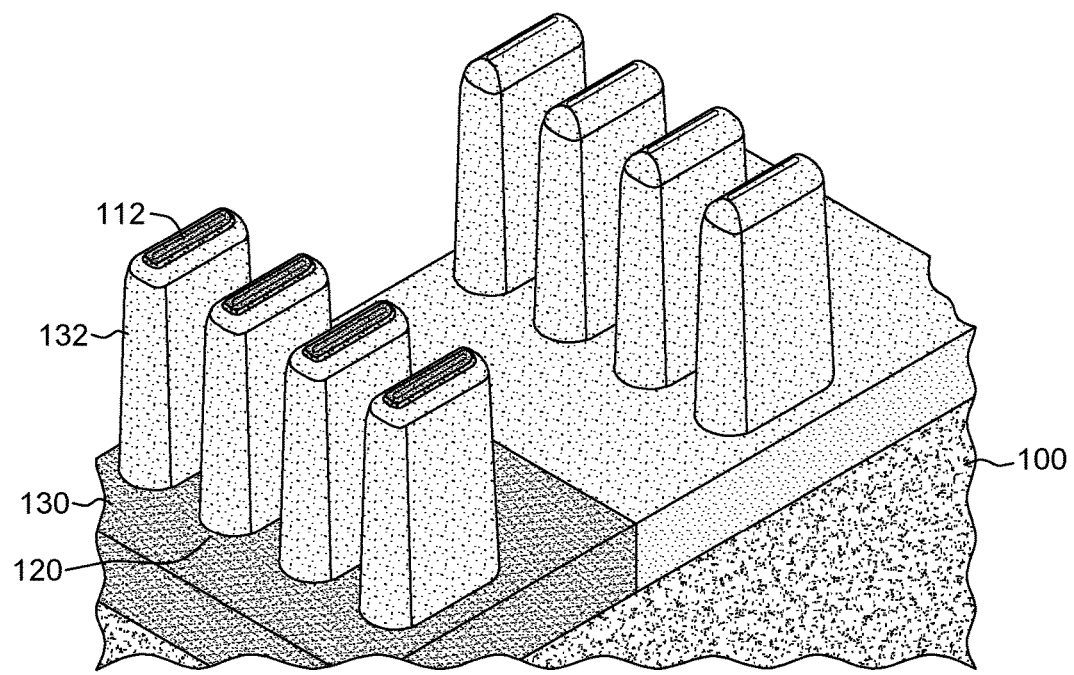
Figure 5B:
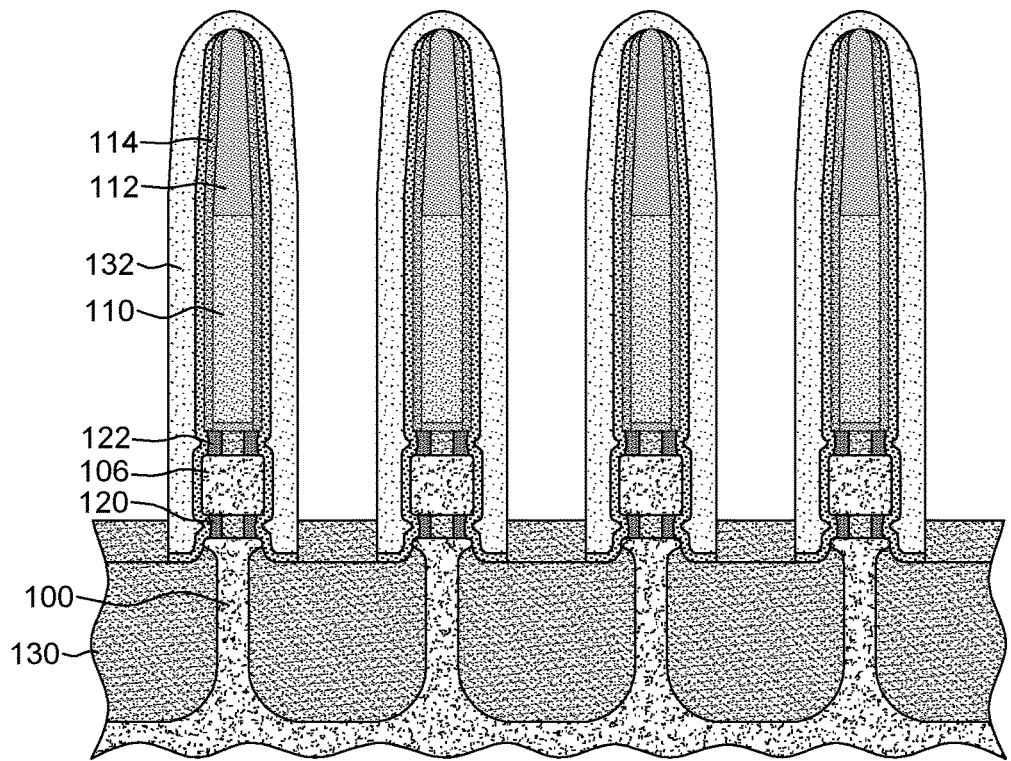
Figure 6A:
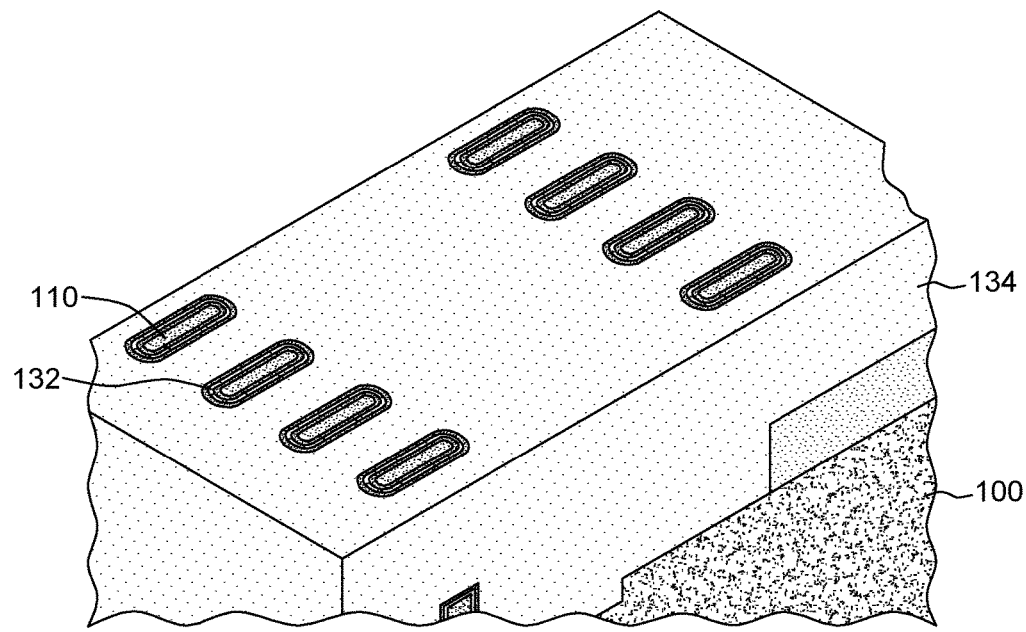
Figure 6B:
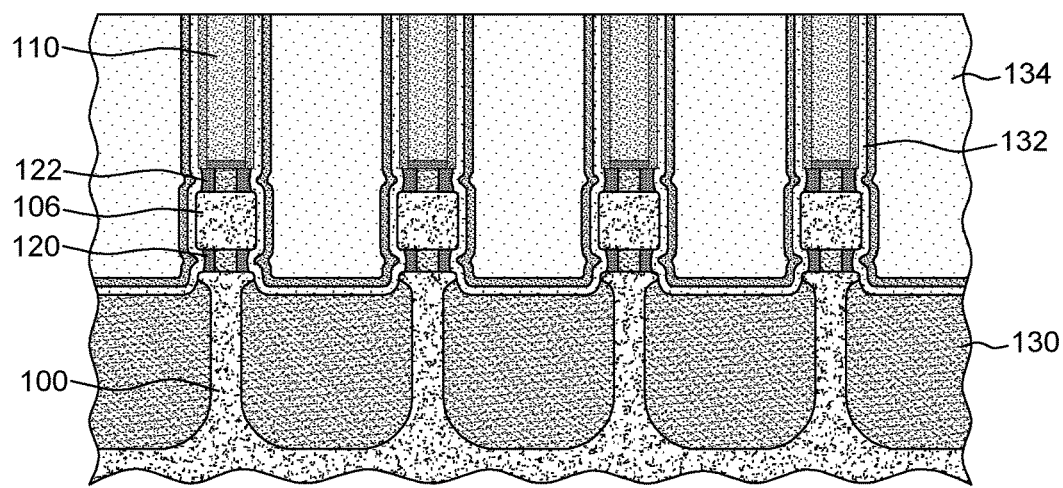

FIGS. 5A-5B shows that this processing also replaces the planar surface of the substrate 100 with a self-aligned bottom source/drain conductor 130. The processing in FIGS. 5A-5B involves protecting the fin with a protective material layer 132, and then removing a substrate portion (the area where item 130 is present in FIG. 5B) of the substrate 100 adjacent the planar surface, without affecting the fin, but using the fin (or more properly the protective material layer 132) to self-align the substrate portion that is removed. Then, the processing forms (e.g., epitaxially grows) the bottom source/drain conductor 130 (e.g., heavily doped SiGe, etc.) in the substrate portion recess, again using only the protected fin to align the location of the bottom source/drain conductor 130.

Alternatively, the bottom source/drain conductor 130 can be deposited or implanted into the substrate 100, again using the protective material layer 132 to self-align such processing. During later thermal cycles, the impurities in the bottom source/drain conductor 130 diffuse into the adjacent portions of the substrate 100, making such portions of the substrate 100 conductors, and providing a conductive path between the bottom source/drain conductor 130 and the channel 106. Alternatively, while the substrate portion is removed, but before the bottom source/drain conductor 130 is formed, impurity doping by implant or diffusion can be applied to the exposed portion of the substrate 100 to make those portions of the substrate 100 conductors. As a further alternative, such doping may additionally be done after the epitaxial growth of the bottom source/drain conductor 130. It should be understood that one or more of these options may be used together to form the bottom source/drain doping region.

As shown in FIGS. 6A-7B, such processing similarly uses self-aligned steps to replace the hardmask fin portion 110, 112 with a top source/drain conductor 140. The process of replacing the hardmask fin portion 110, 112 with the top source/drain conductor 140 involves forming (e.g., growing, depositing, etc.) an additional blanket protective interlayer dielectric (ILD) layer 134 (e.g., oxide, etc.), and planarizing/removing the top portions of the structure shown in FIGS. 5A-5B, to result in the reduced height structure shown in FIGS. 6A-6B (e.g., using chemical mechanical polishing (CMP), etc.). This removes the top of the hardmask 112, and exposes the bottom portion of the hardmask 110 that is within the protective material layer 132 and protective ILD layer 134.

Figure 7A:
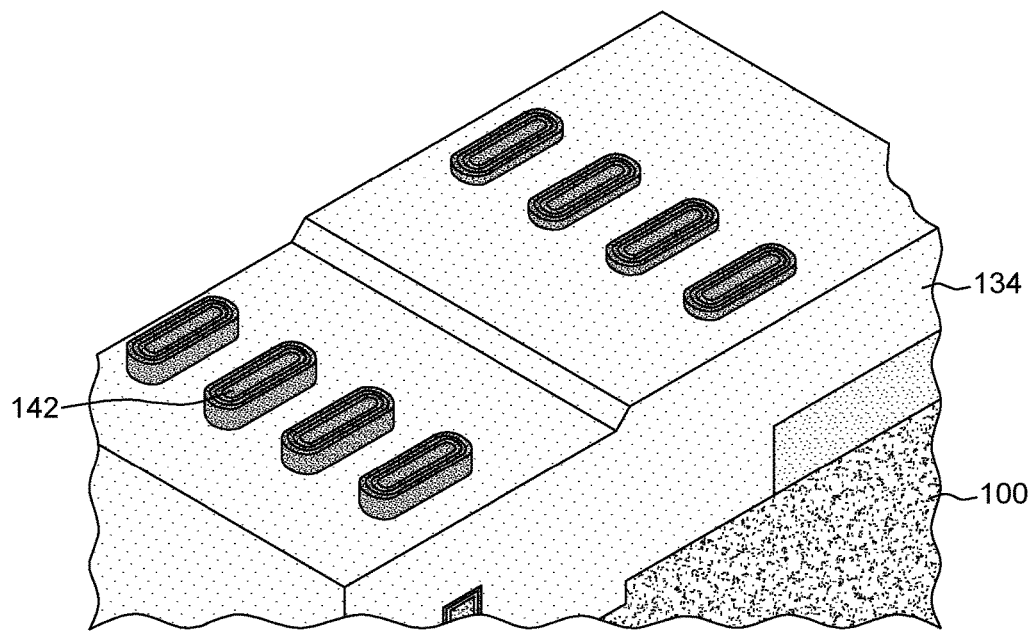
Figure 7B:
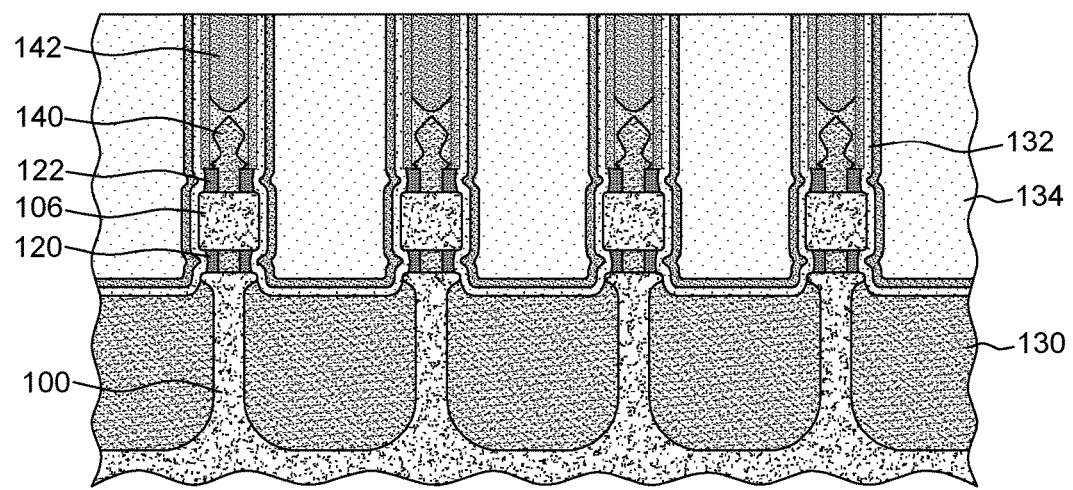

Then, as shown in FIGS. 7A-7B, the hardmask fin portion 110 is selectively removed (e.g., a selective material removal process that only attacks the hardmask 110, and leaves all other surfaces 132, 134 substantially unaffected) to leave a top source/drain opening 142 in the sacrificial protective material 132, where the hardmask fin portion 110 was previously located. Critically, the remaining portion of epitaxial layer (which is identified using numeral 108 for consistency) is then optionally etched selectively to the channel 106, resulting in exposure of the channel material. This top source/drain opening in the sacrificial protective material 132 may then extend down to the channel fin portion 106 because all of the hardmask and epitaxial layer 108 is removed from within the sacrificial protective material. Then, the top source/drain conductor 140 can be formed only in the top source/drain opening 142, and be connected directly to the top of the channel fin portion 106, (e.g., by being epitaxially grown on/from the top of the channel fin portion 106 within the top source/drain opening 142) resulting in vertical self-alignment of the top source/drain junction to the top of the epitaxial channel material. Therefore, this provides a substantial benefit of vertical self-alignment of the top source/drain junction to the channel. Alternatively, the top source/drain junction may be formed by implant or diffusion doping, or by silicidation, or these processes may be combined with the epitaxial growth process to form the top source/drain conductor. Such doping or silicidation may be performed directly on the channel 106, or may be performed on epitaxial layer 108, depending upon the desired structure (and this covers the case where layer 108 may be removed (or not) at this point, and where processing other that epitaxial growth is used to form the top source/drain). Again, this formation/growth process is self-aligned by the opening 142 in the sacrificial protective material 132 on the hardmask, and does not require the alignment of masks or other features. The top and bottom source/drain conductors 140, 130, or their doping levels, species or polarities, can be different for differently doped transistors (such as for CMOS transistors) by protecting some transistors, while others are doped.

Figure 8A:
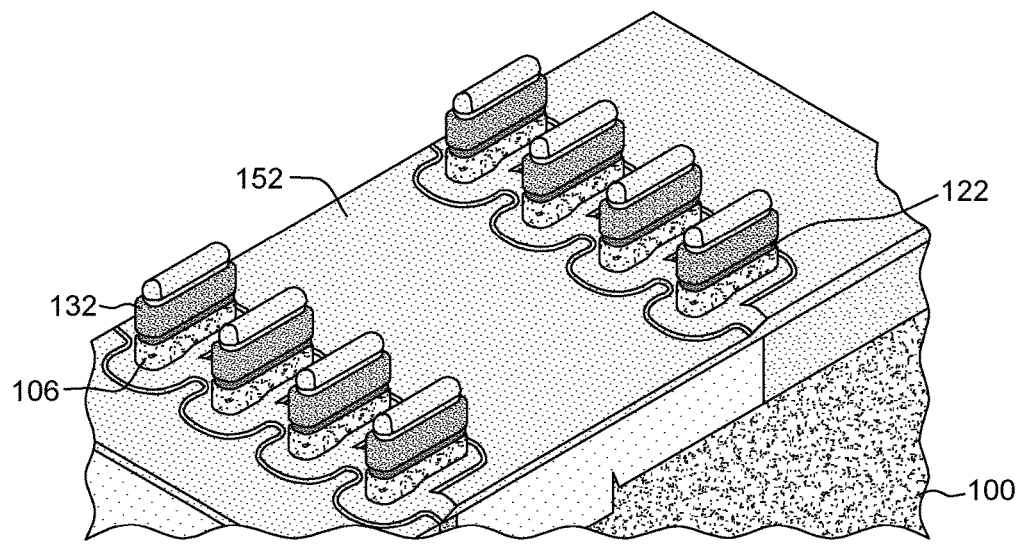
Figure 8B:
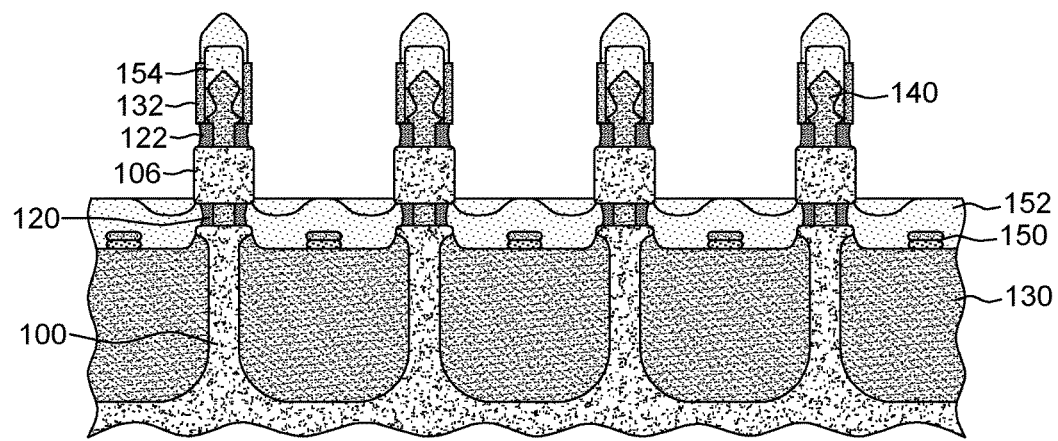

Subsequently, a cap material 154 is formed above the top source/drain (e.g. silicon nitride or low-k material), and the protective ILD material 134 is removed selectively to the cap 154 and liners 132. The liners are then removed selectively to the spacers 122 and the channel 106, as shown in FIGS. 8A-8B. Additionally, a bottom insulator spacer 150, 152 (simply identified using numeral 150 hereafter) is formed on the bottom source/drain conductor 130. The bottom insulator spacer 150 is formed (possibly of many insulator layers) to cover the bottom source/drain conductor 130, and to extend a vertical distance from the bottom source/drain conductor 130 that is greater than or equal to the distance that the bottom of the bottom gate length limit insulator 120 is from the bottom source/drain conductor 130 such that the bottom source/drain conductor is completely encapsulated, leaving the channel material 106 exposed. In view of this, for ease of reference, some of the discussion herein combines the bottom gate length limit insulator 120 and the bottom insulator spacer 150 into a single conceptual item (in that all are positioned similarly, and all are insulators); however, in this implementation, this bottom insulator can actually be multiple different insulators. Thus, after formation, for ease of discussion herein, the top surface of the bottom gate length limit insulator 120 and the bottom insulator spacer 150 can be considered a single surface (even though the insulator may have multiple elements 120, 150).

Figure 9A:
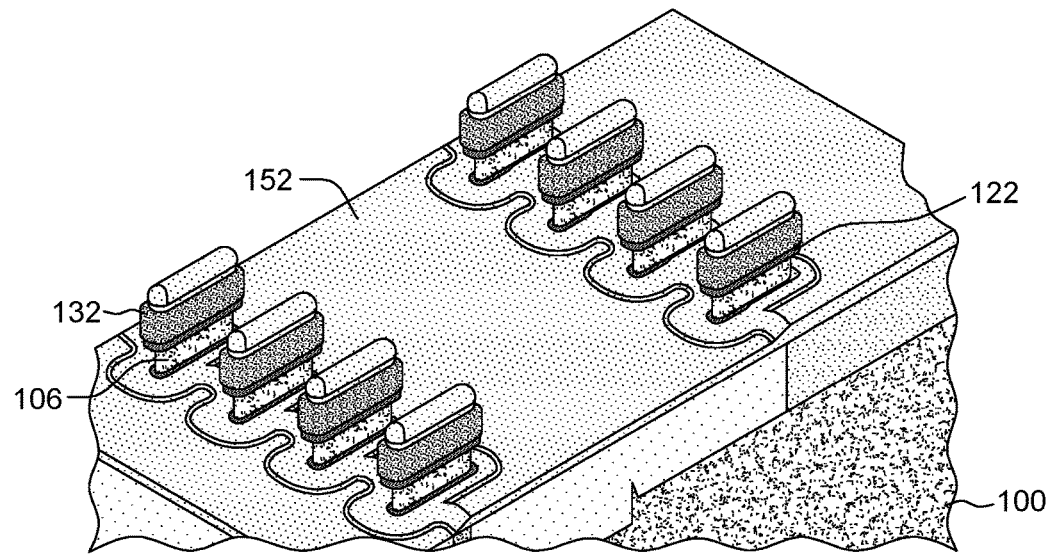
Figure 9B:
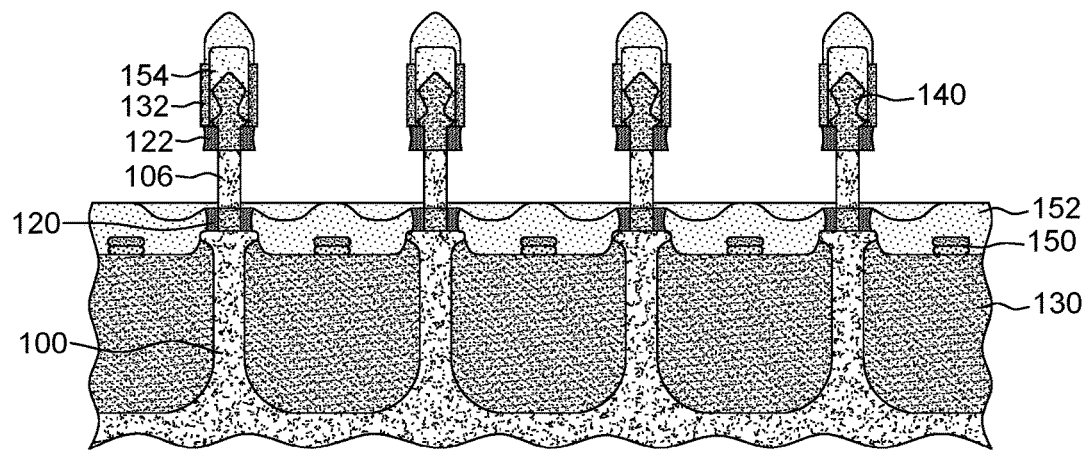

Additionally, as shown in FIGS. 9A-9B, these methods narrow the channel fin portion 104-108 (or more specifically, the middle portion of the channel fin portion 106 that is between the top gate length limit insulator 122 and the bottom gate length limit insulator 120) such that a horizontal step is formed between the etched-back channel 106 and the top notch 108, the second notch 104 and dielectrics 120 and 122. This may be performed using isotropic or anisotropic etching, using a selective material removal processes that only attack the material of the middle portion of the fin 106 without substantially attacking the exposed dielectrics 120, 122, 132 and 154. Various implants or later in-diffusion of dopants (during thermal cycles) may be made to the middle portion 106 of the fin to control channel doping, or it may remain with its starting doping concentration. Again, the channel fin portion dopants can be different for differently doped transistors (such as for CMOS transistors or different device types).

Figure 10A:
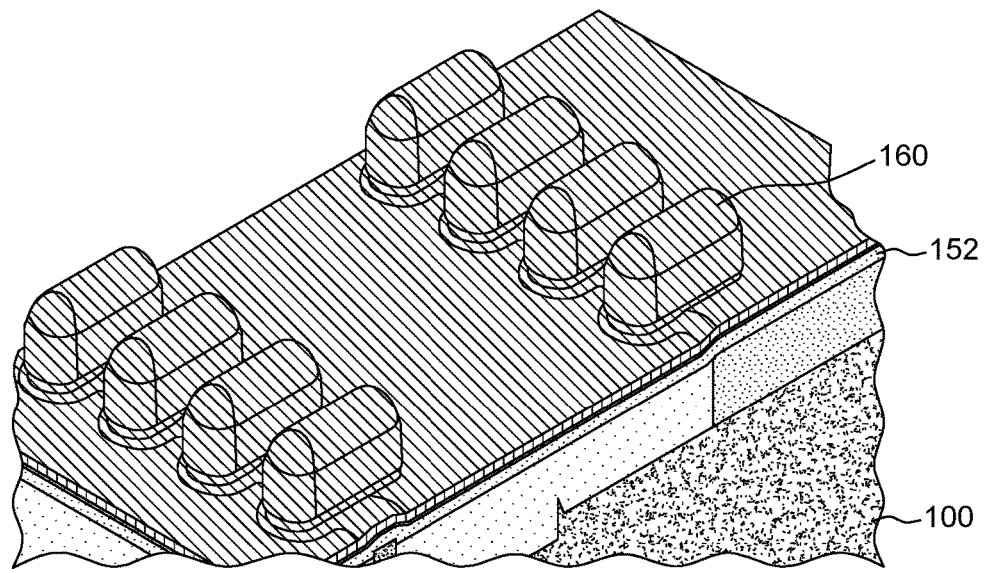
Figure 10B:
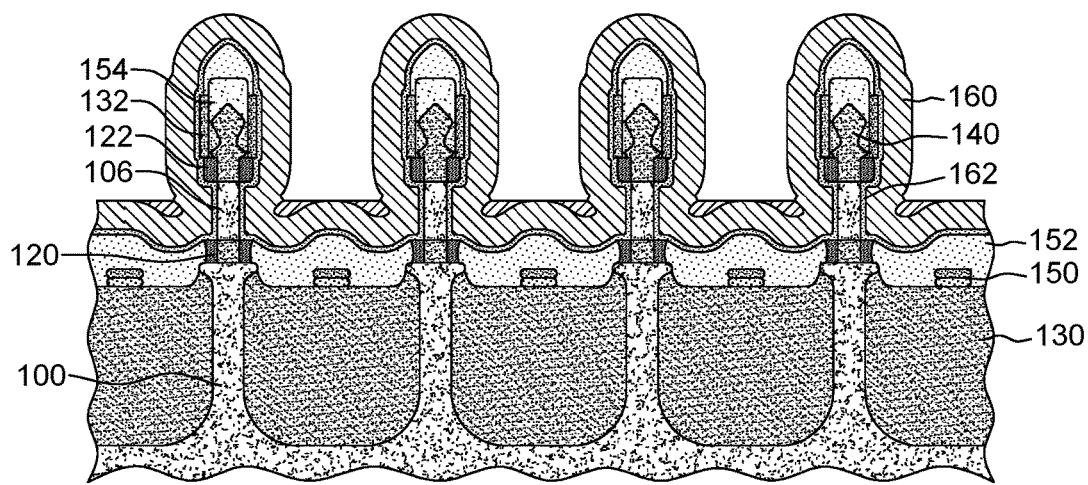
Figure 11A:
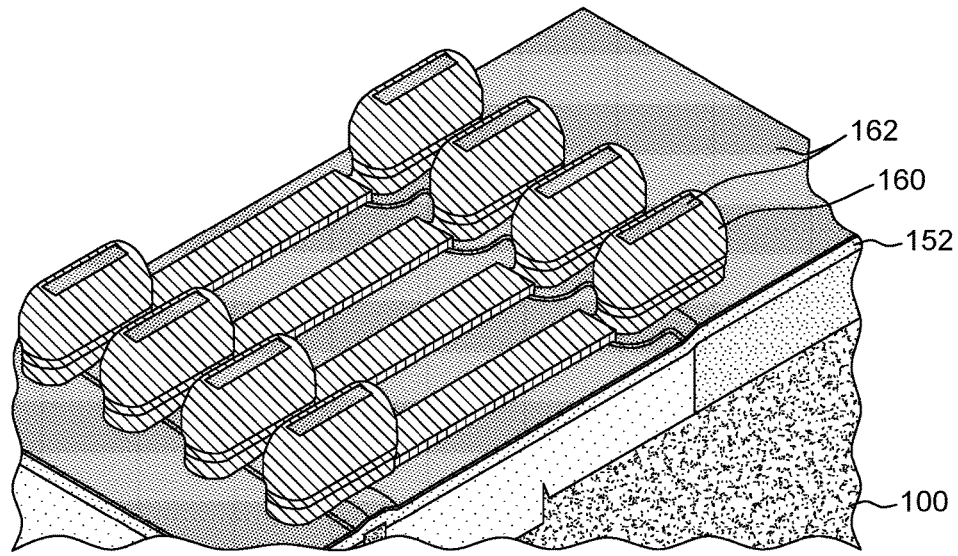
Figure 11B:
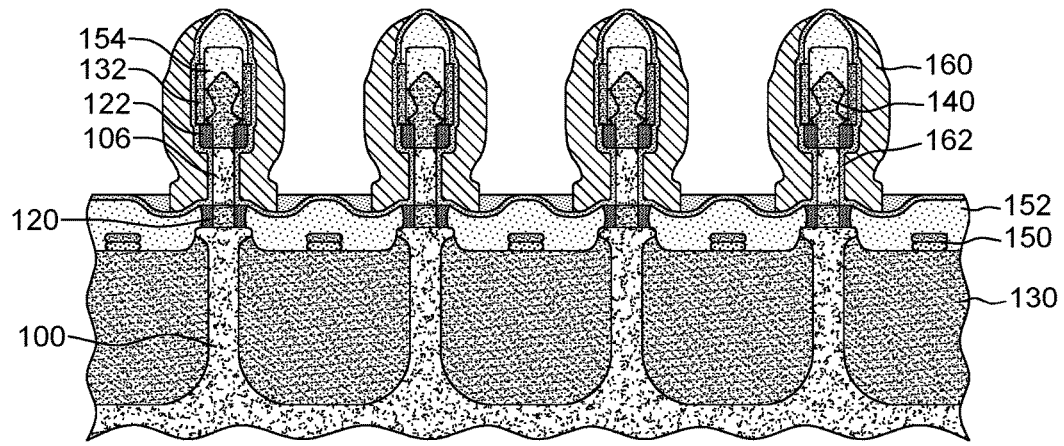

Also, as shown in FIGS. 10A-10B, such methods form a gate insulator 162 (e.g., grow an oxide) at least on the channel fin portion 104-108, and then deposit a gate conductor 160 on the gate insulator 162. The gate conductor 160 can include any appropriate conductive material, including metals (W, Ti, TiN, TiAlC (titanium aluminum chloride) etc.), doped silicon, polysilicon, etc. As shown in FIGS. 11A-11B, the gate 160 can then be patterned using lithography, spacer-defined patterning, or combinations thereof (e.g., using an OPL (an organic processing layer, such as spin-on-carbon), a resist, etc.), using a subsequent etch process (e.g., reactive ion etching (RIE), wet etch, etc.); however, again this etching process does not determine gate length, as such is determined by the vertical distance between the top gate length limit insulator 122 and the bottom gate length limit insulator 120/bottom insulator spacer 150.

Figure 12A:
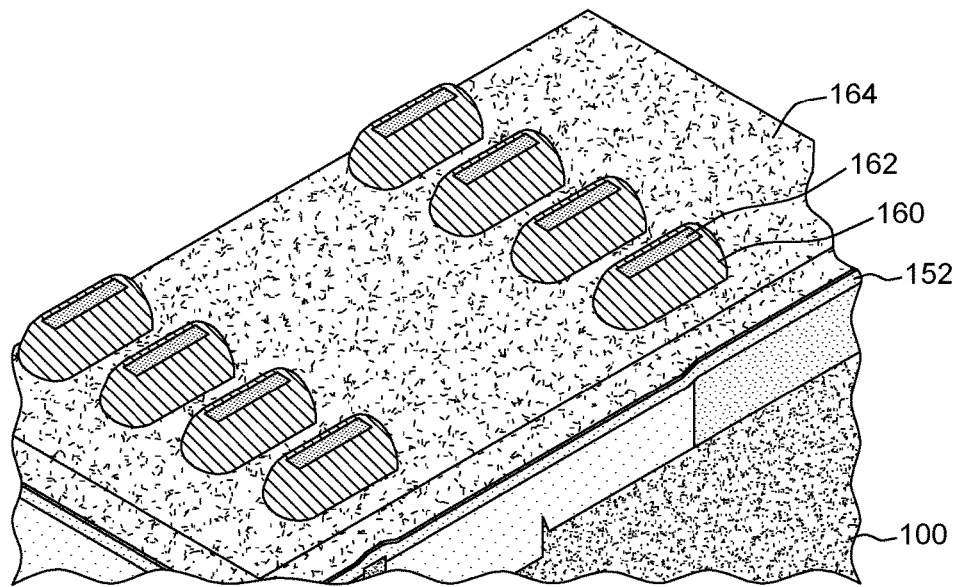
Figure 12B:
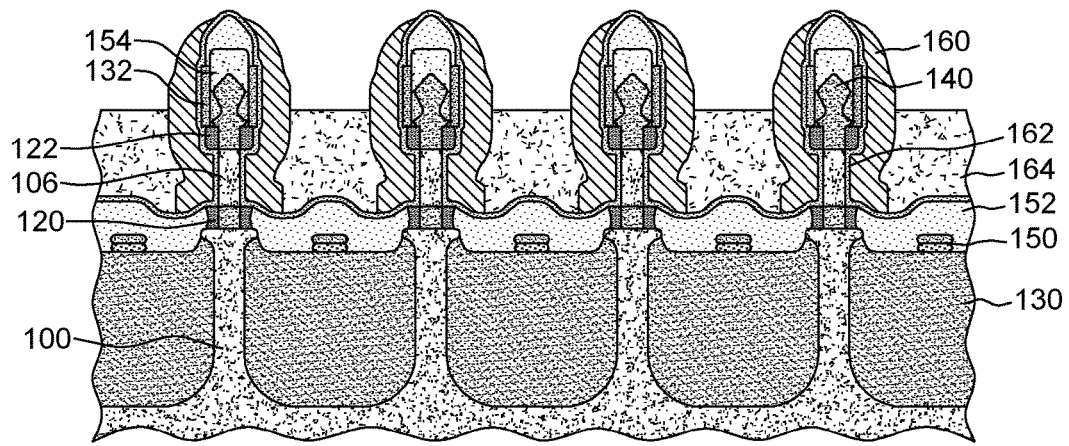

As shown in FIGS. 12A-12B, a gate mask 164 (e.g., a nitride, oxide, optical planarization layer (OPL; an organic layer, such as spin-on-carbon, etc.)) is then formed on the bottom insulator spacer 150 and the remaining gate conductor 160. This step may include a CMP step for this gate mask 164. The thickness of the gate mask 164 on the bottom insulator spacer 150 is then optionally controlled using an etchback or deposition process to be greater than the distance from the bottom spacer 150 to the gate length limit insulator 122. In other words, the gate mask 164 is formed to cover the bottom insulating spacer 150, and the lower portion of the fin up to at least the gate length limit insulator 122.

Figure 13A:
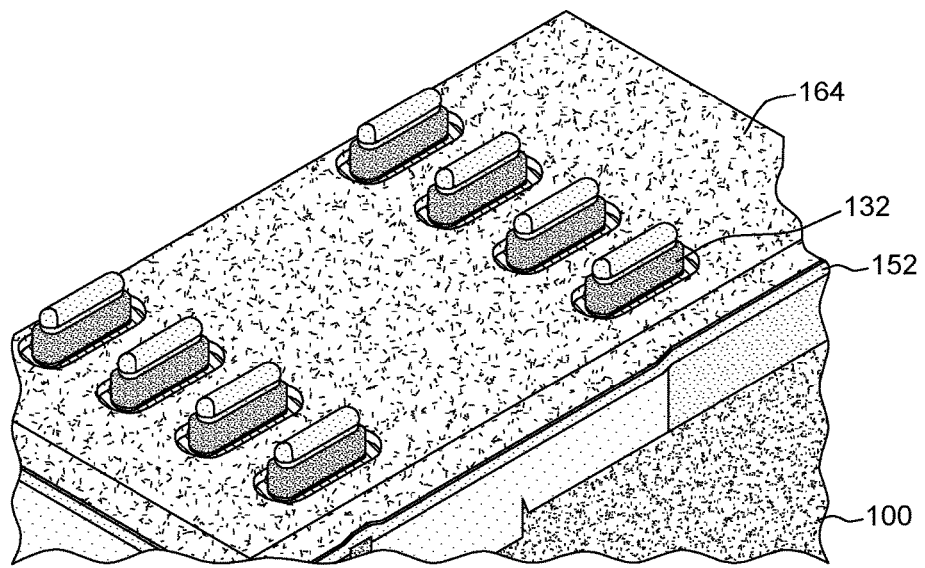
Figure 13B:
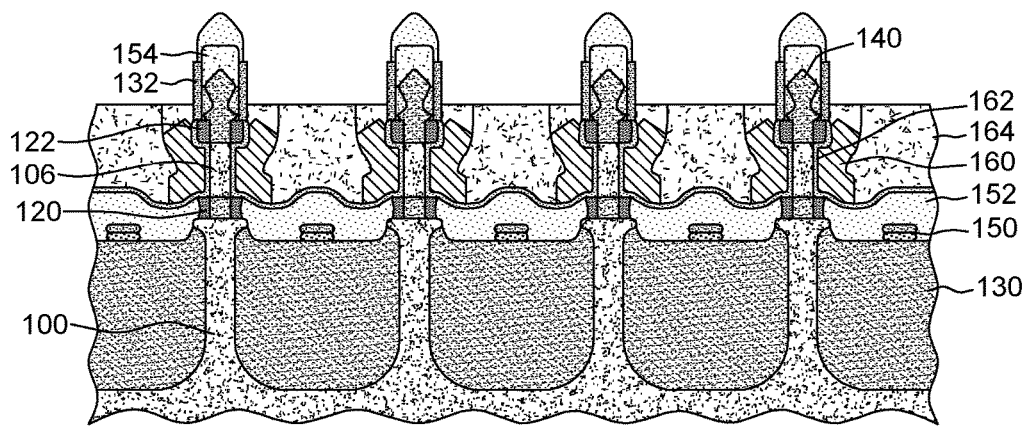
Figure 14A:
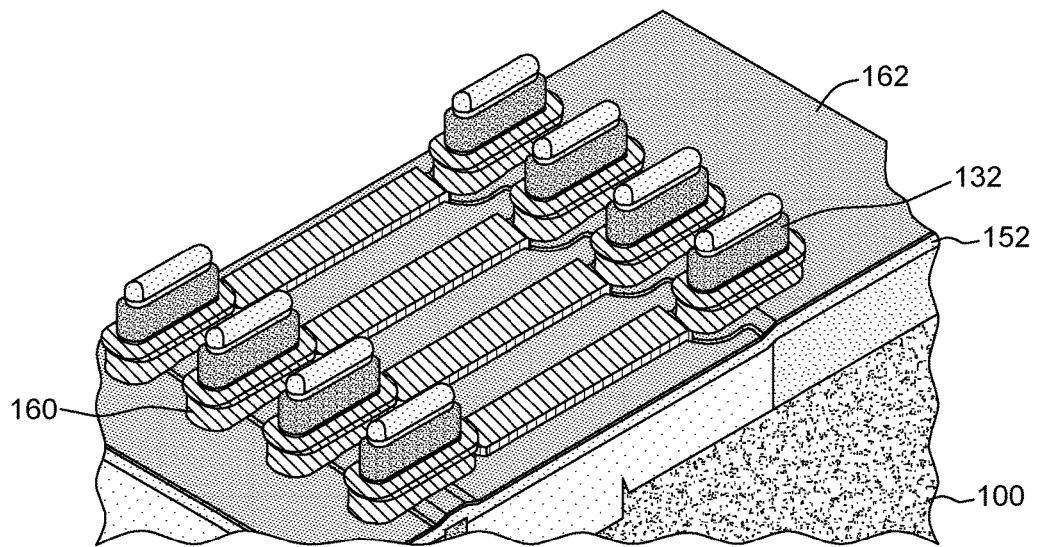
Figure 14B:
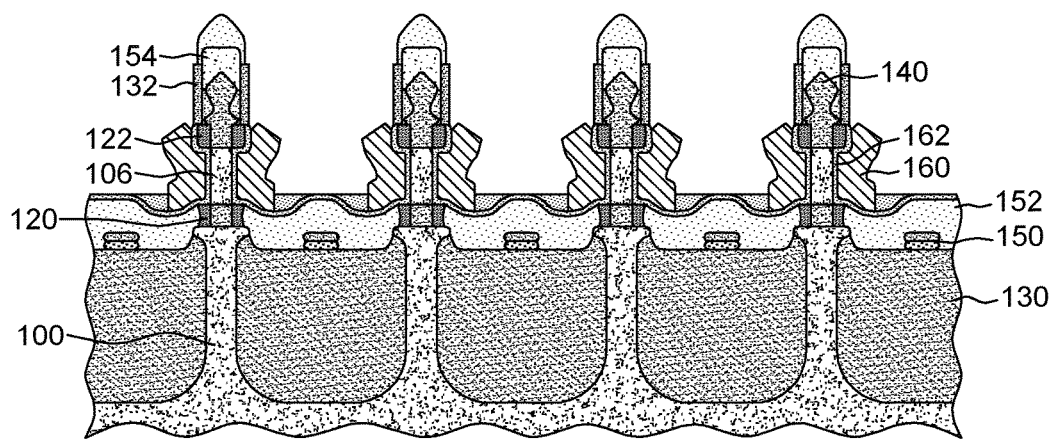

With the gate mask 164 in place, as shown in FIGS. 13A-13B these methods remove the portion of the gate conductor 160 that is left exposed by the gate mask 164, using any appropriate selective material removal process. The gate conductor height may be greater than or less than that of gate mask 164. Alternatively, the gate mask 164 may not be etched down to control its thickness, but instead it is merely polished or etched to expose the gate 160: in this case, the gate may be directly etched to control its final height. However, there are many options for this reduction of the gate conductor height, only a few of which are presented in this example. Later, as shown in FIGS. 14A-14B, the gate mask 164 is optionally removed (using a selective material removal process) to leave the gate length L of the gate conductor 160 defined by the vertical distance between the bottom spacer 150 and/or bottom gate length limit insulator 120, and the top gate length limit insulator 122 (also see FIG. 1C).

Therefore, instead of using a material removal (e.g., etching) process to define the gate length L, the vertical distance between the gate length limit insulator 122 and the bottom gate length limit insulator 120 defines the effective gate length that the gate conductor 160 is adjacent the channel fin portion 104-108. Thus, with methods herein, the gate length L of the gate conductor 160 is determined by the position of gate length limit insulators 120, 122, because the thickness of the gate mask 164 on the bottom insulator spacer 150 is greater than the distance from the bottom spacer 150 (and/or bottom gate length limit insulator 120) to the gate length limit insulator 122; and, thus, the gate mask 164 prevents the process of removing the upper portion of the gate conductor 160 on the fin that is exposed by the gate mask 164 from removing any of the gate conductor 160 between the gate length limit insulator 122 and the bottom insulator spacer 150 and/or bottom gate length limit insulator 120.

In other words, the process of removing of the portion of the gate conductor 160 on the fin that is exposed by the gate mask 164 avoids affecting the gate length of the gate conductor 160, and the gate length of the gate conductor 160 is not determined by a material removal process. Instead, the vertical distance between the gate length limit insulator 122 and the bottom gate length limit insulator 120 defines the effective gate length because even if the gate conductor 160 extends beyond the gate length limit insulators 120, 122, such insulators prevent the voltage in the gate conductor 160 from significantly affecting any portion of the channel fin portion 104-108 that extends beyond the gate length limit insulator 122 and the bottom gate length limit insulator 120.

Figure 15A:
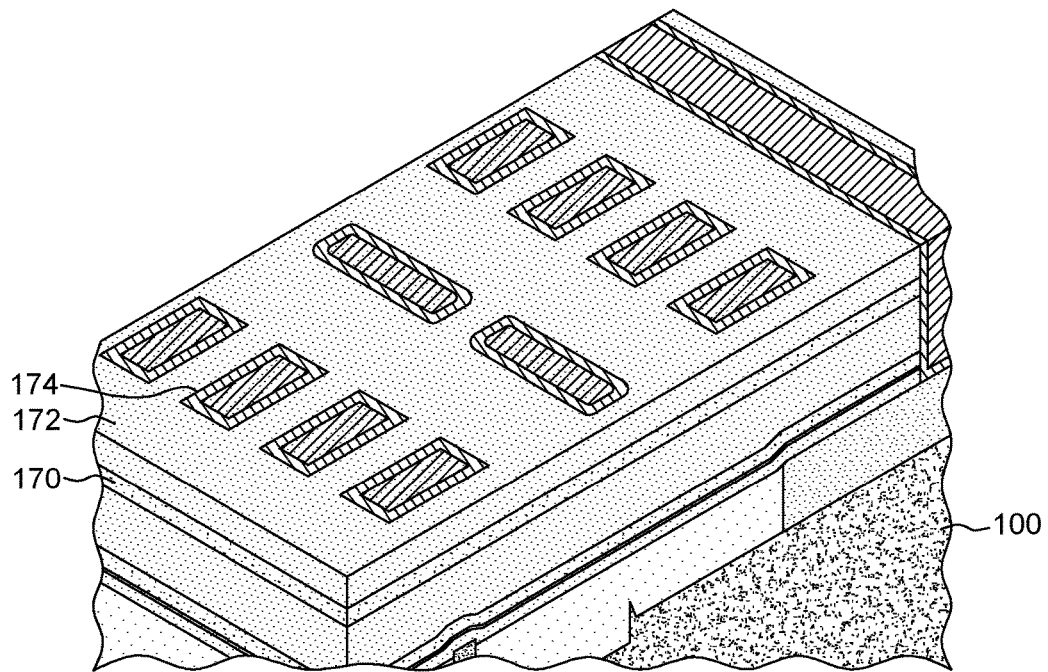
FIGS. 15A-15B are schematic diagrams illustrating perspective and cross-sectional views of vertical FETs formed according to embodiments herein.
Figure 15B:
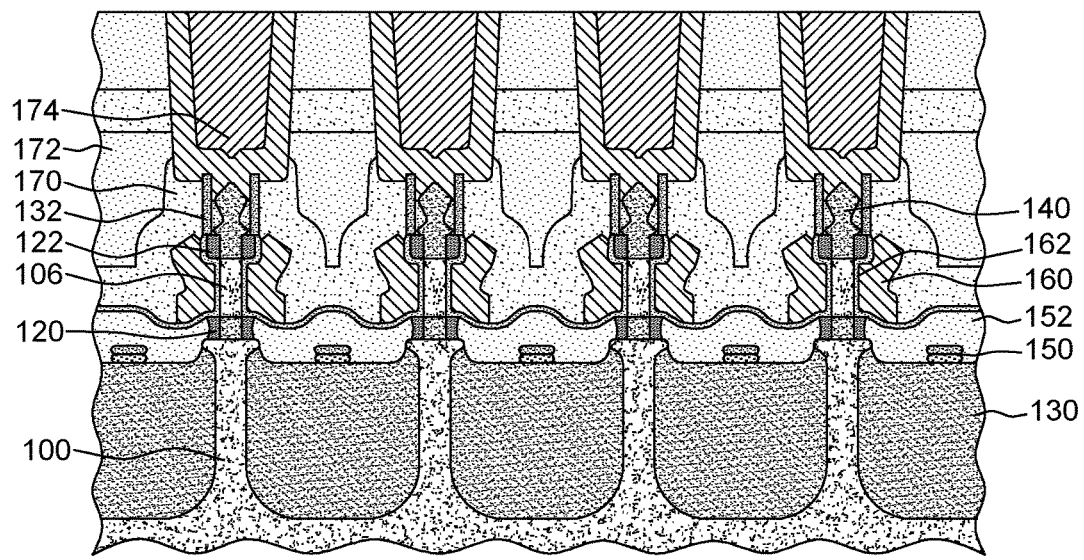

After such processing, as shown in FIGS. 15A-15B, inter-layer dielectrics (ILD) 170, 172, conductive contacts 174, etc., are formed using any appropriate processing, whether currently known or developed in the future, to complete the device. Additionally, if the foregoing is used with multiple complementary transistor devices, some of the devices can be masked, while the other's receive a doping polarity impurity; and later the doped devices can be masked, while the previously protected devices receive an opposite polarity impurity doping.

Figure 16:
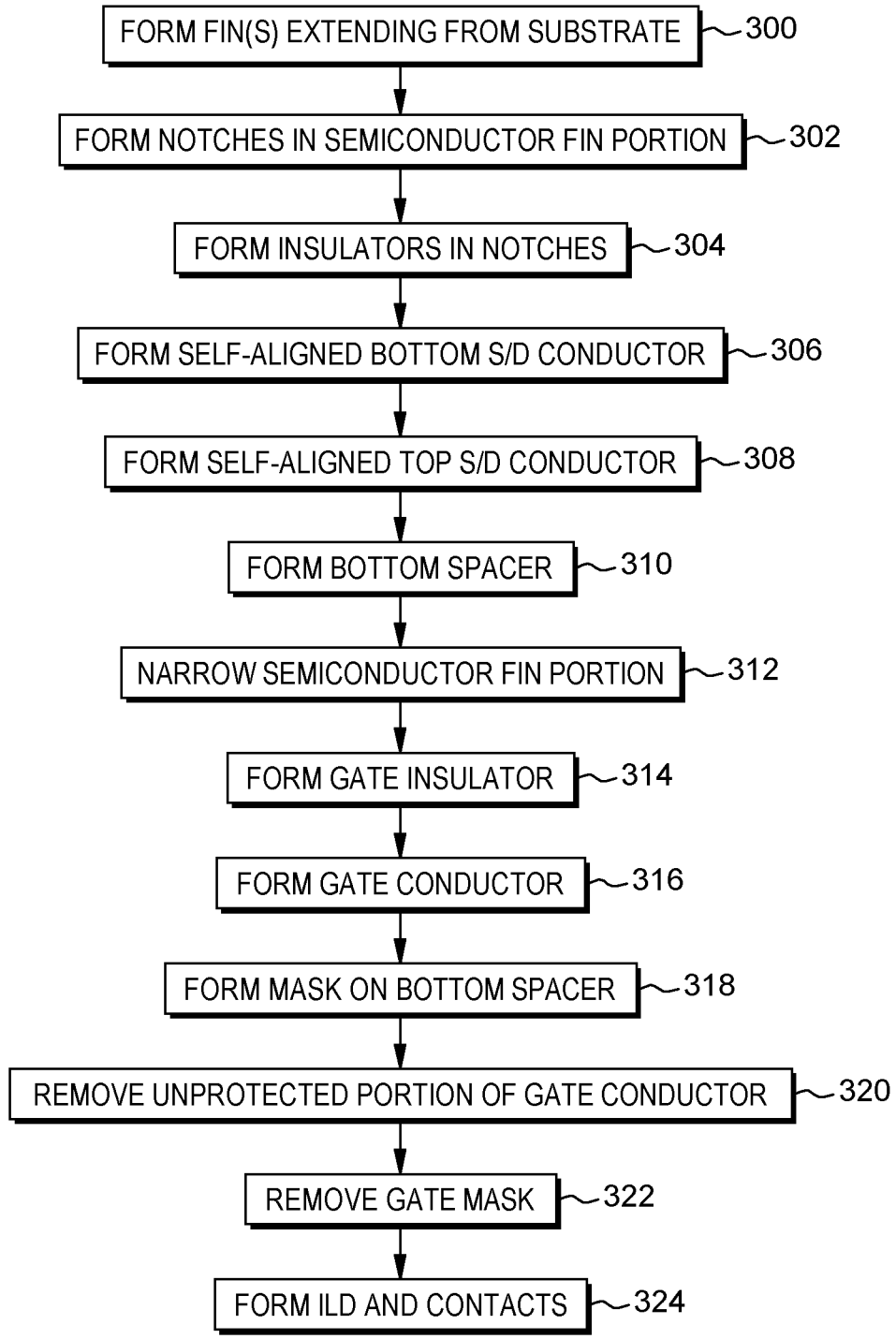
FIG. 16 is a flow diagram illustrating embodiments herein.

FIG. 16 is a flowchart of some methods herein that form at least one fin extending from, and perpendicular to, a planar surface of a substrate in item 300. While actual production can simultaneously form many fins adjacent one another, and simultaneously form adjacent transistors with opposite polarity doping impurities (e.g., complementary metal oxide semiconductor (CMOS) transistors) the following discussion is framed in the context of a single fin, as any simultaneously formed fins can have the same features. The fin formed in item 300 includes a channel fin portion closest to the substrate (adjacent the substrate) and a hardmask fin portion furthest away from the substrate (distal to the substrate).

More specifically, in item 300, the processing can first grow a multi-layer channel fin portion stack epitaxially. Such a stack can include, for example, a layer of Si, a thinner doped silicon layer (e.g., SiGe), an overlying thicker silicon layer, and another thinner doped layer (of similar material to the first thinner doped layer). Hardmasks fin patterns (e.g., nitrides) are patterned on the multi-layer channel fin portion stack, and dissimilar spacers are formed on the sidewalls of the hardmask (e.g., nitride and oxide spacers). The dissimilar spacers on the hardmasks increases the effective critical dimensions (CD), and creates a "boundary" for later epitaxial growth processes. The materials selected should have an etch selectivity to the fin hardmask (HM) (SiCO, for example). The channel fin portion is then patterned out of the multi-layer channel fin portion stack, using any appropriate material removal process (e.g., etching, etc.) where the hardmasks operate as the patterning mask. The fin patterning process in item 300 removes material from the multi-layer channel fin portion stack, and should stop past the lower thinner doped layer, but as close to the lower thinner doped layer as possible; however, the depth of the material removal process into the multi-layer channel fin portion stack is not critical, so long as both thinner doped layers are exposed by the material removal process.

In item 302, such methods simultaneously form a top notch in the channel fin portion where the channel fin portion meets the hardmask fin portion, and potentially a second notch in the channel fin portion between the top notch and where the channel fin portion will meet a bottom insulating spacer. More specifically, the processing in item 302 is performed by selective material removal processing that attacks the material of the thinner doped layers, without affecting the other exposed materials (e.g., selective etchback of spacer epitaxial layer over the channel fin portion to form the notches or cavities). Thus, in the processing in item 302, the width of the channel fin portion is reduced at the top notch and the second notch in the processing in item 302.

In item 304, such methods simultaneously form a gate length limit insulator in the top notch, and potentially a bottom gate length limit insulator in the second notch in an oxidation process. For example, processing that fills the notches with an insulator (e.g., atomic layer deposition (ALD) of a nitride or oxide) and covers all exposed surfaces can be followed by a material removal process that is controlled to allow the insulator to remain in the notches.

As shown in item 306, such methods also replace the exposed planar surface of the substrate with a bottom source/drain conductor. The processing in item 306 involves protecting the fin with a protective material layer, and then removing a substrate portion adjacent the planar surface, without affecting the fin, but using the fin to self-align the substrate portion that is removed. Then, the processing in item 306 forms (e.g., epitaxially grows) the bottom source/drain conductor (e.g., heavily doped SiGe) in the substrate portion recess, again using only the protected fin to align the location of the bottom source/drain conductor, avoiding any need for the alignment of masks or other features.

In item 308, such methods similarly use self-aligned processing to replace the hardmask fin portion with a top source/drain conductor. The process of replacing the hardmask fin portion with the top source/drain conductor in item 308 involves forming a sacrificial protective material on the fin (e.g., at least on the hardmask fin portion), and again this uses only the fin to align the location of the sacrificial protective material (e.g., an oxide, nitride, etc.). Then, the hardmask fin portion is removed (e.g., a planarization process, followed by a selective material removal process that only attacks the hardmask) to leave a top source/drain opening in the sacrificial protective material, where the hardmask fin portion was previously located. This top source/drain opening in the sacrificial protective material extends down to the top of the channel fin portion because all of the hardmask is removed from within the sacrificial protective material. Then, the top source/drain conductor can be formed only in the top source/drain opening, and be connected to the top of the channel fin portion, (e.g., by being epitaxially grown on the channel fin portion within the top source/drain opening). Again, this formation/growth process in item 308 is self-aligned by the opening in the sacrificial protective material, and does not require the alignment of masks or other features.

In item 310, such methods form a bottom insulator spacer on the bottom source/drain conductor. The bottom insulator spacer is formed (possibly of many insulator layers) to cover the bottom source/drain conductor, and to extend a distance from the bottom source/drain conductor that is greater than or equal to the distance that the bottom gate length limit insulator is from the bottom source/drain conductor.

Additionally, in item 312, these methods narrow the middle of the channel fin portion (the portion of the semiconductor fin that is between the gate length limit insulator and the bottom insulator spacer) to the same reduced width used for the top notch and second notch. In item 314, such methods form (grow an oxide in a heated oxygen-rich environment) a gate insulator at least on the channel fin portion, and then deposit a gate conductor on the gate insulator in item 316. The gate conductor can include any appropriate material, including metals (W, Ti, TiN, SiCO, etc.). Additionally, in item 316, the overall thickness of the gate conductor can be reduced using a subsequent masking and material removal processing (e.g., gate etchback, etc.).

Such methods then form a gate mask on the bottom insulator spacer in item 318. The thickness of the gate mask on the bottom insulator spacer is formed in item 318 to be greater than the distance from the bottom spacer to the gate length limit insulator. In other words, the gate mask is formed in item 318 to cover the bottom insulating spacer, and the lower portion of the fin, up to at least the gate length limit insulator.

With the gate mask in place, these methods remove the portion of the gate conductor that is left exposed by the gate mask in item 320 (using any appropriate selective material removal process). Alternatively, the gate materials may be etched directly using a timed etchback process where the remaining gate height is taller than the top gate length limit insulator. Later, in item 322, the gate mask is removed (using a selective material removal process) to leave the gate length of the gate conductor defined by the vertical distance between the bottom spacer and the gate length limit insulator.

Therefore, instead of using a material removal process (e.g., gate etchback) to define the gate length, the vertical distance between the gate length limit insulator and the bottom gate length limit insulator defines the effective gate length that the gate conductor is adjacent the channel fin portion. Thus, with methods herein, the gate length of the gate conductor is determined by the vertical separation between the gate length limit insulators, because the thickness of the gate mask on the bottom insulator spacer is greater than the distance from the bottom spacer to the gate length limit insulator; and, thus, the gate mask prevents the process of removing the portion of the gate conductor on the fin that is exposed by the gate mask in item 320 from removing any of the gate conductor between the gate length limit insulator and the bottom insulator spacer. In other words, the process of removing of the portion of the gate conductor on the fin that is exposed by the gate mask in item 320 avoids affecting the gate length of the gate conductor, and the gate length of the gate conductor is not determined by a material removal process, but instead the vertical distance between the gate length limit insulators defines the effective gate length.

After such processing, in item 324, inter-layer dielectrics (ILD), contacts, etc., are formed using any processing, whether currently known or developed in the future, to complete the device. Additionally, if the foregoing is used with multiple complementary transistor devices, some of the devices can be masked, while the other's receive a doping polarity impurity; and later the doped devices can be masked, while the previously protected devices receive an opposite polarity impurity doping.

For purposes herein, a "semiconductor" is a material or structure that may include an implanted impurity that allows the material to sometimes be a conductor and sometimes be an insulator, based on electron and hole carrier concentration. As used herein, "implantation processes" can take any appropriate form (whether now known or developed in the future) and can include, for example, ion implantation, etc.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

Within a transistor, the semiconductor (or channel region) is positioned between a conductive "source" region and a similarly conductive "drain" region and when the semiconductor is in a conductive state, the semiconductor allows electrical current to flow between the source and drain. A "gate" is a conductive element that is electrically separated from the semiconductor by a "gate oxide" (which is an insulator) and current/voltage within the gate changes the conductivity of the channel region of the transistor.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can include any material appropriate for the given purpose (whether now known or developed in the future) and can include, for example, Si, SiC, SiGe, SiGeC, other III-V or II-VI compound semiconductors, or organic semiconductor structures, etc. The "shallow trench isolation" (STI) structures are well-known to those ordinarily skilled in the art and are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a metal or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., plasma etching, etc.) to remove the unprotected portions of the material below the resist to be patterned. The resist is subsequently removed to leave the underlying material patterned according to the light exposure pattern (or a negative image thereof).

For purposes herein, "sidewall spacers" (used in self-aligned double patterning, self-aligned quadruple patterning, etc.) are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as sidewall spacers.

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method of merging one or more non-transactional stores and one or more thread-specific transactional stores into one or more cache line templates in a store buffer in a store cache. In other words, one or more computer hardware devices can be created that are configured to implement the method and processes described herein with reference to the Figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method, comprising:
    forming a fin extending from, and perpendicular to, a planar surface of a substrate, the fin includes a channel adjacent to the substrate and a hardmask distal to the substrate;
    forming notches in the channel;
    forming gate length limit insulators in each of the notches;
    forming a bottom source/drain in the planar surface of the substrate where the channel meets the planar surface;
    replacing the hardmask with a top source/drain by:
        removing a portion of the hardmask to leave a top source/drain opening aligned with the channel; and
        forming the top source/drain only in the top source/drain opening;
    forming a bottom spacer on the bottom source/drain;
    forming a gate insulator on at least the channel;
    depositing a gate conductor on the gate insulator; and
    removing a portion of the gate conductor on the fin that is further from the bottom spacer than a distance between the gate length limit insulators to leave a gate length of the gate conductor defined by the distance between the gate length limit insulators.

2. The method according to claim 1, the notches are formed in the channel where the channel meets the hardmask, and where the channel meets the bottom spacer; and
    the distance between the gate length limit insulators defines the gate length that the gate conductor is adjacent to the channel.

3. The method according to claim 1, the bottom spacer extends a distance from the bottom source/drain greater than or equal to a distance that a bottom gate length limit insulator of the gate length limit insulators is from the bottom source/drain.

4. The method according to claim 1, the forming of the bottom source/drain comprises:
    removing a substrate portion adjacent to the planar surface without effecting the fin; and
    forming the bottom source/drain in the substrate portion using only the fin to align a location of the bottom source/drain.

5. The method according to claim 1, the replacing of the hardmask with the top source/drain comprises:
    forming a sacrificial protective material on the hardmask using only the fin to align a location of the sacrificial protective material;
    removing the hardmask to leave the top source/drain opening in the sacrificial protective material; and
    forming the top source/drain only in the top source/drain opening and connected to the channel, as self-aligned by the top source/drain opening in the sacrificial protective material.

6. The method according to claim 5, the forming of the top source/drain comprises epitaxially growing the top source/drain on the channel within the top source/drain opening of the sacrificial protective material.

7. The method according to claim 1, the gate length of the gate conductor is determined by positions of each of the gate length limit insulators, such that the removing of the portion of the gate conductor on the fin avoids effecting the gate length of the gate conductor, and the gate length of the gate conductor is not determined by a material removal process.

8. A method, comprising:
forming a fin extending from, and perpendicular to, a planar surface of a substrate, the fin includes a channel fin portion adjacent to the substrate and a hardmask fin portion distal to the substrate;
forming notches in the channel fin portion, the channel fin portion is reduced to a reduced width at each of the notches;
forming gate length limit insulators in each of the notches;
forming a bottom source/drain conductor in the planar surface of the substrate where the channel fin portion meets the planar surface;
replacing the hardmask fin portion with a top source/drain conductor;
forming a bottom insulator spacer on the bottom source/drain conductor;
narrowing the channel fin portion between the gate length limit insulators and the bottom insulator spacer to the reduced width;
forming a gate insulator on at least the channel fin portion;
depositing a gate conductor on the gate insulator;
forming a gate mask on the bottom insulator spacer, a thickness of the gate mask on the bottom insulator spacer is greater than a distance between the gate length limit insulators;
removing a portion of the gate conductor on the fin that is exposed by the gate mask; and
removing the gate mask to leave a gate length of the gate conductor defined by the distance between the gate length limit insulators.

9. The method according to claim 8, the notches are formed in the channel fin portion where the channel fin portion meets the hardmask fin portion, and where the channel fin portion meets the bottom insulator spacer; and
the distance between the gate length limit insulators defines the gate length that the gate conductor is adjacent to the channel fin portion.

10. The method according to claim 8, the bottom insulator spacer is formed to extend a distance from the bottom source/drain conductor greater than or equal to a distance that a bottom gate length limit insulator of the gate length limit insulators is from the bottom source/drain conductor.

11. The method according to claim 8, the forming of the bottom source/drain conductor comprises:
removing a substrate portion adjacent to the planar surface without effecting the fin; and
forming the bottom source/drain conductor in the substrate portion using only the fin to align a location of the bottom source/drain conductor.

12. The method according to claim 8, the replacing of the hardmask fin portion with the top source/drain conductor comprises:
forming a sacrificial protective material on the hardmask fin portion using only the fin to align a location of the sacrificial protective material;
removing the hardmask fin portion to leave a top source/drain opening in the sacrificial protective material; and
forming the top source/drain conductor only in the top source/drain opening and connected to the channel fin portion, as self-aligned by the top source/drain opening in the sacrificial protective material.

13. The method according to claim 12, the forming of the top source/drain conductor comprises epitaxially growing the top source/drain conductor on the channel fin portion within the top source/drain opening of the sacrificial protective material.

14. The method according to claim 8, the gate length of the gate conductor is determined by positions of each of the gate length limit insulators, as the thickness of the gate mask on the bottom insulator spacer is greater than a distance from the bottom insulator spacer to the gate length limit insulators to prevent the removing of the portion of the gate conductor on the fin that is exposed by the gate mask from removing any of the gate conductor between the gate length limit insulators and the bottom insulator spacer, such that the removing of the portion of the gate conductor on the fin that is exposed by the gate mask avoids effecting the gate length of the gate conductor and the gate length of the gate conductor is not determined by a material removal process.

15. A method, comprising:
forming a fin extending from, and perpendicular to, a planar surface of a substrate, the fin includes a channel adjacent to the substrate and a hardmask distal to the substrate;
forming notches in the channel;
forming gate length limit insulators in each of the notches;
forming a bottom source/drain in the planar surface of the substrate where the channel meets the planar surface;
replacing the hardmask with a top source/drain by:
forming a sacrificial protective material on the hardmask using only the fin to align a location of the sacrificial protective material;
removing the hardmask to leave a top source/drain opening in the sacrificial protective material; and
forming the top source/drain only in the top source/drain opening and connected to the channel, as self-aligned by the top source/drain opening in the sacrificial protective material;
forming a bottom spacer on the bottom source/drain;
forming a gate insulator on at least the channel;
depositing a gate conductor on the gate insulator; and
removing a portion of the gate conductor on the fin that is further from the bottom spacer than a distance between the gate length limit insulators to leave a gate length of the gate conductor defined by the distance between the gate length limit insulators.

16. The method according to claim 15, the notches are formed in the channel where the channel meets the hardmask, and where the channel meets the bottom spacer; and
the distance between the gate length limit insulators defines the gate length that the gate conductor is adjacent to the channel.

17. The method according to claim 15, the bottom spacer extends a distance from the bottom source/drain greater than or equal to a distance that a bottom gate length limit insulator of the gate length limit insulators is from the bottom source/drain.

18. The method according to claim 15, the forming of the bottom source/drain comprises:
removing a substrate portion adjacent to the planar surface without effecting the fin; and
forming the bottom source/drain in the substrate portion using only the fin to align a location of the bottom source/drain.

19. The method according to claim 15, the forming of the top source/drain comprises epitaxially growing the top source/drain on the channel within the top source/drain opening of the sacrificial protective material.

20. The method according to claim 15, the gate length of the gate conductor is determined by positions of each of the gate length limit insulators, such that the removing of a portion of the gate conductor on the fin avoids effecting the gate length of the gate conductor, and the gate length of the gate conductor is not determined by a material removal process.

* * * * *